(12) United States Patent
Park et al.

(10) Patent No.: US 6,261,902 B1
(45) Date of Patent: *Jul. 17, 2001

(54) METHOD OF FORMING A TRANSISTOR STRUCTURE

(75) Inventors: Eun Jeong Park; Sung Chul Lee, both of Chungcheongbuk-do (KR)

(73) Assignee: Hyundai Electronics Industries Co., Ltd., Ichon-shi (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/925,490

(22) Filed: Sep. 8, 1997

(30) Foreign Application Priority Data

May 6, 1997 (KR) .................................. 97-17321

(51) Int. Cl.⁷ .................................................. H01L 21/336
(52) U.S. Cl. .......................... 438/257; 438/262; 438/263; 438/266
(58) Field of Search .................................. 438/257, 259, 438/262, 263, 296, 301, 304, 365, 366, 368, 369, 268, 430, 564, 561, 266, 270, 522, 524, 585; 257/270, 316

(56) References Cited

U.S. PATENT DOCUMENTS

| | | | |
|---|---|---|---|
| H204 | * | 2/1987 | Oh et al. .............................. 438/426 |
| 4,331,968 | * | 5/1982 | Gosney, Jr. et al. ............ 365/185.14 |
| 4,353,086 | * | 10/1982 | Jaccodine et al. ................... 438/248 |
| 4,419,150 | * | 12/1983 | Soclof ................................... 438/561 |
| 4,569,701 | * | 2/1986 | Oh ......................................... 438/561 |
| 4,676,847 | * | 6/1987 | Lin ........................................ 438/561 |
| 4,814,840 | * | 3/1989 | Kameda ............................... 257/316 |
| 4,833,098 | * | 5/1989 | Kato ..................................... 438/430 |
| 4,839,309 | * | 6/1989 | Easter et al. ......................... 438/295 |
| 5,045,490 | * | 9/1991 | Esquivel et al. .................... 438/259 |
| 5,086,007 | * | 2/1992 | Ueno .................................... 438/270 |
| 5,324,684 | * | 6/1994 | Kermani et al. .................... 438/561 |
| 5,406,111 | * | 4/1995 | Sun ...................................... 438/430 |
| 5,429,970 | * | 7/1995 | Hong ................................... 438/259 |
| 5,460,987 | * | 10/1995 | Wen et al. ........................... 438/589 |
| 5,605,852 | * | 2/1997 | Bencuya ............................. 438/270 |
| 5,707,897 | * | 1/1998 | Lee et al. ............................ 438/257 |
| 5,773,343 | * | 6/1998 | Lee et al. ............................ 438/259 |
| 5,882,971 | * | 3/1999 | Wen .................................... 438/276 |

OTHER PUBLICATIONS

N. Ajika et al., "A 5 Volt Only 16M Bit Flash Eeprom Cell With a Simple Stacked Gate Structure", LSI Research and Development Laboratories, Mitsubishi Electronic Corporation, reprint of IEDM Tech. Digest, pp. 115–118, 1990.

* cited by examiner

Primary Examiner—Charles Bowers
Assistant Examiner—Jack Chen
(74) Attorney, Agent, or Firm—Fleshner & Kim, LLP

(57) ABSTRACT

A semiconductor device in which polysilicon is used to form source and drain regions in an initial process step so as to reduce resistance of bit lines and minimize a junction capacitance and thus improve its reliability, and a method for fabricating the same are disclosed, the semiconductor device including a semiconductor substrate, trenches formed in predetermined areas of the semiconductor substrate, an insulating layer formed in the trenches and beneath a surface of the substrate to have a recess, a polysilicon layer formed on the insulating layer in the trench, source and drain regions formed at both sides of the polysilicon layer beneath a surface of the semiconductor substrate, and gates formed over the semiconductor substrate.

10 Claims, 6 Drawing Sheets

METHOD OF FORMING A TRANSISTOR STRUCTURE

BACKGROUND OF THE INVENTION

1. Field of the Invention

The present invention relates to a method for fabricating a semiconductor device and, more particularly, to a semiconductor device in which polysilicon is used to form source and drain regions in an initial process step so as to reduce resistance of bit lines and minimize a junction capacitance and thus improve its reliability, and a method for fabricating the same.

2. Discussion of the Related Art

Due to buried $N^+$ layers(hereinafter referred to as $BN^+$ layer), which is used in flash EEPROM cells and mask ROM cells, it is possible to make virtual ground, and the number of contact holes is diminished to reduce sizes of chips. Source and drain regions are commonly formed in a final process step in a case a semiconductor device is fabricated using $BN^+$ layers.

A conventional method for fabricating a semiconductor device will be described with reference to FIGS. 1A to 1C which are cross-sectional views showing process steps of a method for fabricating a semiconductor device.

First, a photoresist film is coated on a semiconductor substrate 11 or a p well as shown in FIG. 1A. In this case, instead of a photoresist film 13 alone being coated, an insulating layer is first deposited on a semicondutor substrate 11 and then a photoresist film 13 is coated on the insulating layer.

Next, as shown in FIG. 1B, the photoresist film 13 over placements of $BN^+$ layers is patterned by exposure and development processes. $N^+$ heavily doped impurity ions are implanted into the semiconductor substrate 11 by using the photoresist pattern 13 as a mask.

Subsequently, the remaining photoresist film 13 is removed as shown in FIG. 1C. Then an annealing process is performed to grow a gate oxide layer 15 on the semiconductor substrate 11 and simultaneously form $BN^+$ layers 17. At this time, the $BN^+$ layers 17 function as source and drain regions. The gate oxide layer 15 is thicker on the $BN^+$ layers than on the semiconductor substrate 11 because the $BN^+$ layers have a high concentration of impurity ions.

According to a conventional method for fabricating a semiconductor device, source and drain regions are formed in an initial process step and gate electrodes are formed right over the source and drain regions so that it can be possible to make virtual ground and the number of contact holes in a cell is minimized to reduce the area of a chip.

However, it has following problems. There is a reduced a voltage applied to bitlines in contact with $BN^+$ layers due to a resistance of the $BN^+$ layers. Moreover, since a junction area of the $BN^+$ layers and a semiconductor substrate increases and thus a junction capacitance on the junction area increases, operational speed of the semiconductor device is lowered.

SUMMERY OF THE INVENTION

Therefore, the present invention is directed to a structure of a semiconductor device and a method for fabricating the same that substantially obviates one or more of problems due to limitations and disadvantages of the related art.

An object of the invention is to provide a method for fabricating a semiconductor device in which $BN^+$ layers are formed of doped polysilicon to be used as source and drain regions so as to reduce a resistance of bitlines and minimize a junction capacitance and thus increase its reliability.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a semiconductor device includes a semiconductor substrate, trenches formed in predetermined areas of the semiconductor substrate, an insualting layer formed beneath a surface of each of the trenches to have a recess, a polysilicon layer formed on the insualting layer in the trench, source and drain regions formed at both sides of the polysilicon layer beneath a surface of the semiconductor substrate, and gates formed over the semiconductor substrate.

In another aspect of the present invention, a method for fabricating a semiconductor device includes the steps of forming trenches in predetermined areas of a semiconductor substrate, forming a first polysilicon layer doped by impurity ions in each of the trenches, diffusing the impurity ions in the first polysilicon layer so as to form source and drain regions at both sides of each of the trenches, and forming a second polysilicon layer on the entire surface and then patterning the second polysilicon layer to form gates.

It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, in which.

DETAILED DESCRIPTION OF THE PREFERRED EMBODIMENTS

According to the present invention, $BN^+$ layers are formed of polysilicon to reduce a resistance of bitlines, and junction areas of the $BN^+$ layers and the semiconductor substrate is minimized, thereby reducing a junction capacitance. Such a semiconductor device of the present invention can be widely applied to flash memories, mask ROMs, and EEPROMs, all of which require high speed performance.

Reference will now be made in detail to the preferred embodiments of the present invention, examples of which are illustrated in the accompanying drawings.

Figure 1A:
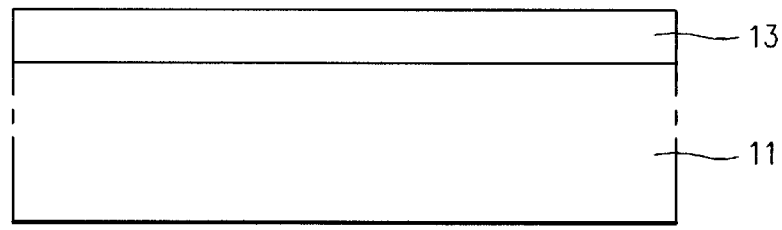
FIGS. 1A to 1C are cross-sectional views showing process steps of a conventional method for fabricating a semiconductor device.
Figure 1B:
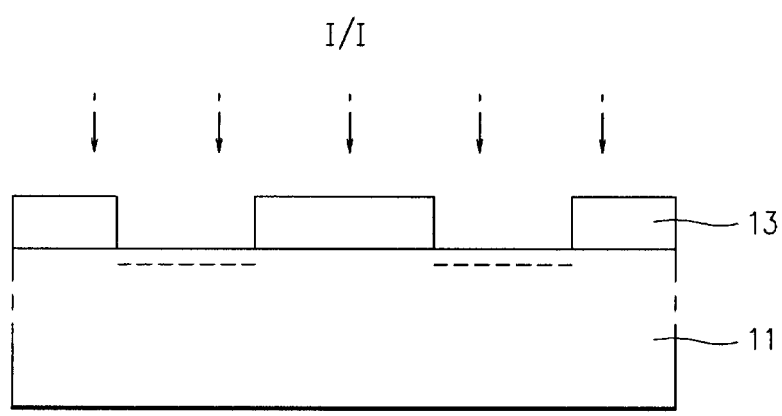
Figure 1C:
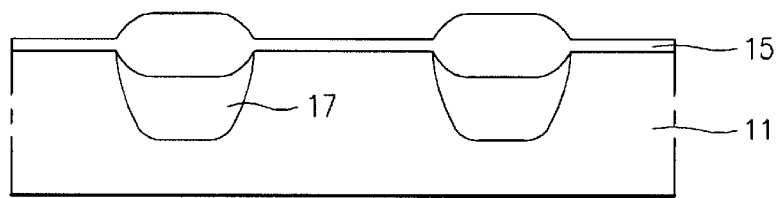
Figure 2:
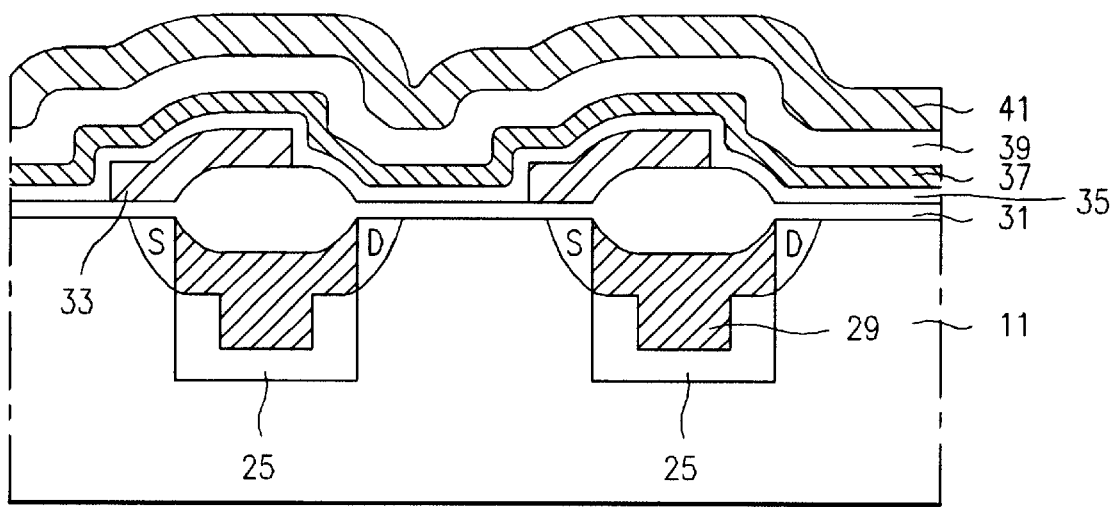
FIG. 2 is a cross-sectional view showing a structure of a semiconductor device according to the present invention.

FIG. 2 is a cross-sectional view showing a structure of a semiconductor device according to the present invention. As shown in FIG. 2, a semiconductor device of the present invention includes a semiconductor substrate, trenches formed in predetermined areas of the semiconductor substrate, an insualting layer formed beneath a surface of each of the trenches to have a recess, a polysilicon layer formed on the insulating layer in each of the trenches, source and drain regions formed beneath the surface of the semiconductor substrate at both sides of the polysilicon layer, and gates formed over the semiconductor substrate. In this case, an insualting layer is placed between the gates and the polysilicon layers. That is, since the polysilicon layer is doped by impurity ions, the polysilicon layer is activated more greatly than the other layer so that the insulating layer is formed to be thicker on the polysilicon layer than on the other area.

A method for fabricating a semiconductor device having the aforementioned structure will be described with reference to FIGS. 3A to 3J which are cross-sectional views showing process steps of a method for fabricating a semiconductor device. This embodiment is manifested on a basis of a flash EEPROM.

Figure 3A:
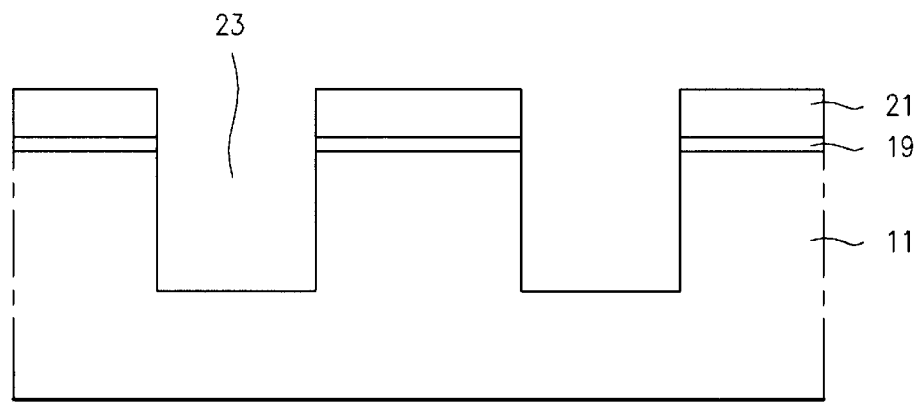
FIGS. 3A to 3J are cross-sectional views showing process steps of a method for fabricating a semiconductor device according to a preferred embodiment of the present invention.

Referring initially to FIG. 3A, a pad oxide layer 19 is grown on a semiconductor substrate 11 and then a first insulating layer 21 is formed on the entire surface. This insulating layer 21 is formed of any one of a silicon nitride layer, an oxide layer, and a photoresist film. Then a photoresist film is coated on the first insulating layer 21 and then is patterned by exposure and development processes to expose the semiconductor substrate 11 over placements of $BN^+$ layers. Subsequently, using the photoresist pattern as a mask, the first insualting layer 21, the pad oxide layer 19, and the semiconductor substrate 11 are etched to a predetermined depth, thereby forming trenches.

Figure 3B:
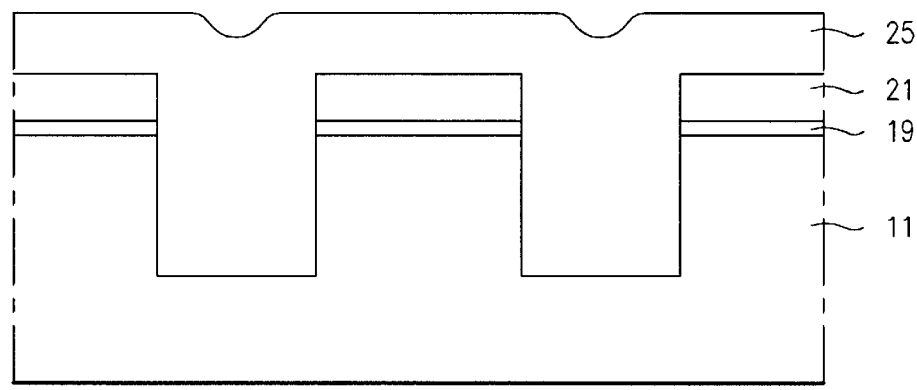

Referring to FIG. 3B, the remaining photoresist film is removed and then a second insulating layer 25 is deposited on the entire surface. At this time, this second insualting layer 25 is deposited by a chemical vapor deposition (CVD) process so as to reduce a junction capacitance by minimizing a junction area of the semiconductor substrate and a polysilicon layer which will be formed in a following process step.

Figure 3C:
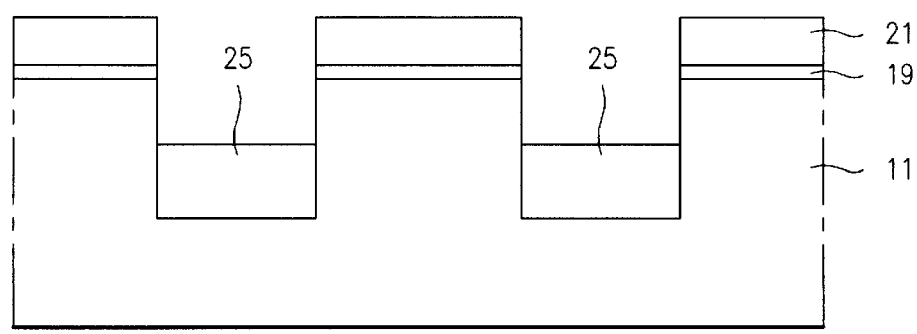

Referring to FIG. 3C, the second insulating layer 25 is etched-back by a predetermined depth to remain in the trenches. At this time, the second insulating layer 25 doesn't remain be as high as the surface of the semiconductor substrate 11. Thus, polysilicon will fill the rest of the trench as high as the surface of the substrate 11.

Figure 3D:
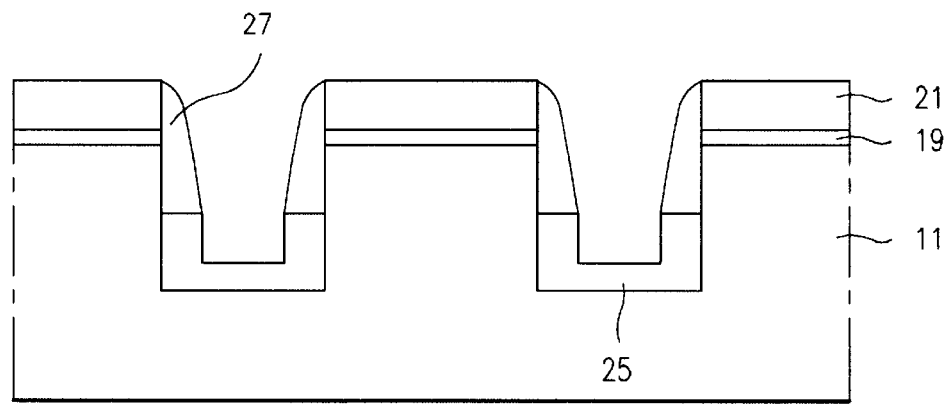

Referring to FIG. 3D, a third insulating layer is deposited on the entire surface including the second insulating layer 25 and then is etched-back to form a sidewall spacer 27 on the side surface of each of the trenches. Thereafter, using the sidewall spacers 27 as masks, the second insulating layer 25 in each of the trenches is etched by a predetermined depth to have a recess. At this time, the recess is for minimizing a junction area of the semiconductor substrate 11 and a polysilicon layer and maximizing an amount of impurity ions which will be diffused from the polysilicon layer.

Figure 3E:
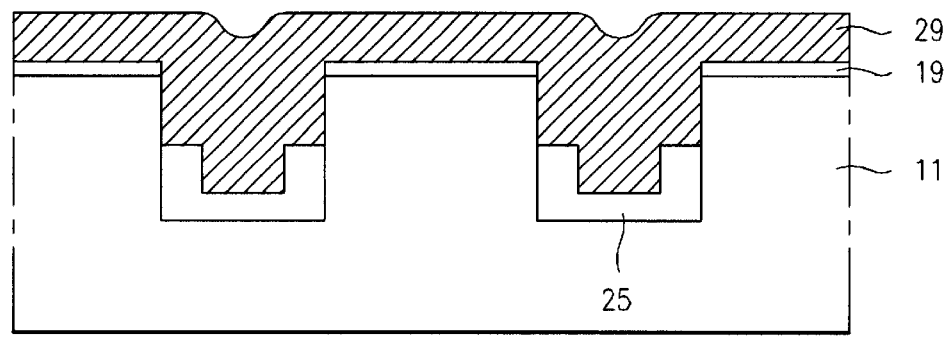

Referring to FIG. 3E, the sidewall spacers 27 are removed, and; a first polysilicon layer 29 is formed on the entire surface including the second insulating layer 25. This first polysilicon layer 29 used is a polysilicon layer that is heavily doped by impurity ions.

Figure 3F:
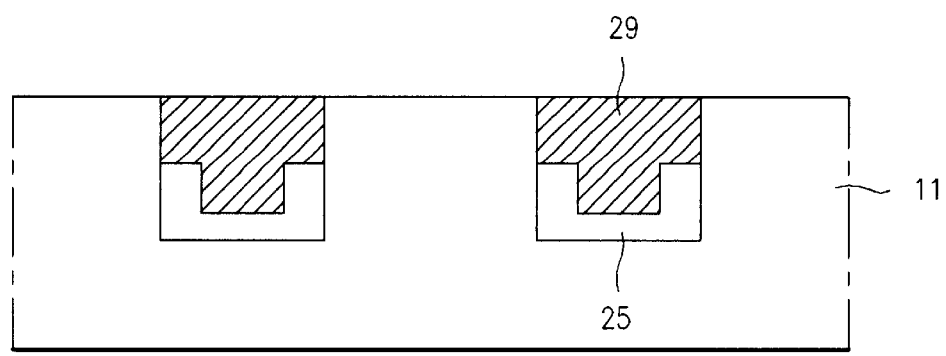

Referring to FIG. 3F, the first polysilicon layer 29 and the pad oxide layer 19 above the surface of the semiconductor substrate 11 are removed so that the first polysilicon layer 29 and the second insulating layer 25 are buried in the trenches. The thickness of the first polysilicon layer 29 is determined taking into account the etch ratio of the first polysilicon layer 29 and the pad oxide layer 19 such that there is no problem with etching the polysilicon layer 29 only above the semiconductor substrate 11.

Figure 3G:
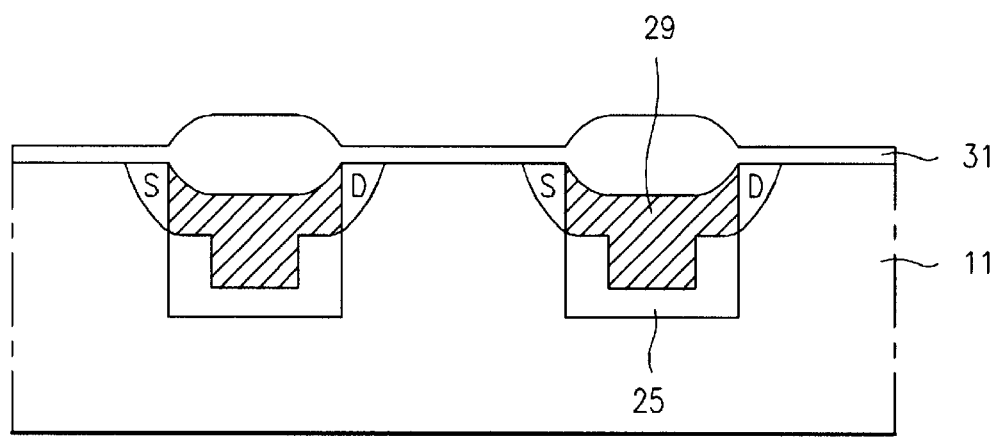

Referring to FIG. 3G, a gate insulating layer 31 is grown on the entire surface of the semiconductor substrate 11. The gate insulating layer 31 has a thicker thickness on the first polysilicon layer 29 than on the semiconductor substrate 11 because the impurity ions in the first polysilicon layer 29 are actively diffused by an annealing process. By this annealing process, source S and drain D regions are formed at both sides of the first polysilicon layer 29.

Figure 3H:
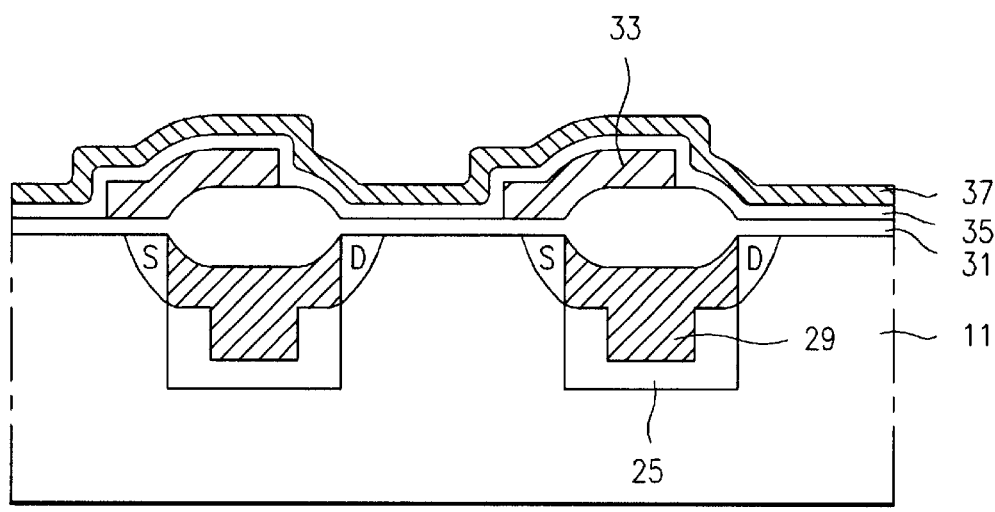

Referring to FIG. 3H, a second polysilicon layer is deposited on the gate insulating layer 31 and then selectively removed to form a plurality of floating gates 33 over predetermined areas of the semiconductor substrate 11. Next, a fourth insulating layer 35 is deposited on the entire surface of the floating gates 33 and then a third polysilicon layer 37 used as a control gate is formed on the fourth insulating layer 35. This fourth insulating layer 35 functions as an interpoly insulating layer that electrically insulates the floating gates 33 from the third polysilicon layer 37.

Figure 3I:
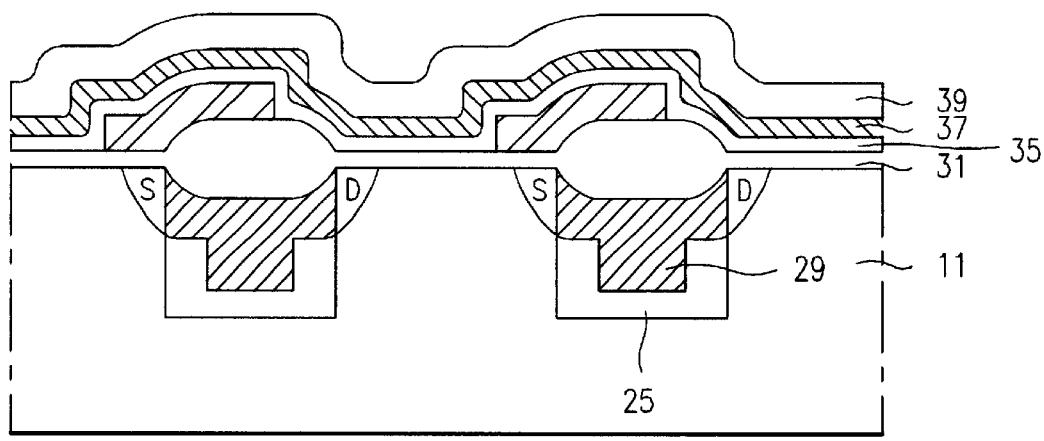

Referring to FIG. 3I, a fifth insulating layer 39, which is a high temperature low pressure dielectric (HLD) layer, is formed on the third polysilicon layer 37 used as a control gate.

Figure 3J:
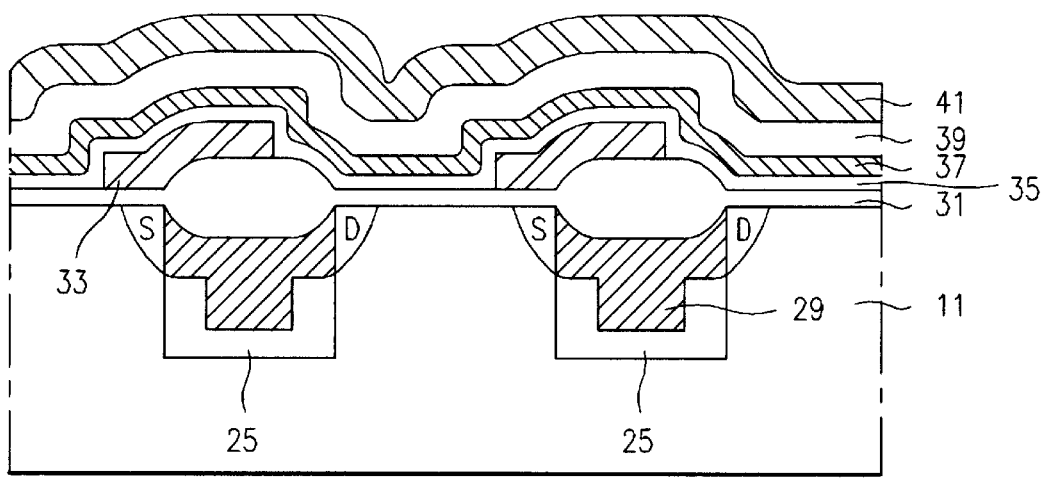

Referring finally to FIG. 3J, a fourth polysilicon layer 41 used as an erasable gate is deposited on the fifth insulating layer 39, thereby completing the process of a semiconductor device according to the present invention.

The method for fabricating a semiconductor device has advantages. First since polysilicon layers are used as $BN^+$ layers in contact with bitlines, a resistance of the bitlines is reduced and thus a voltage applied to the bitlines is reduced. Further, since the $BN^+$ layers are formed by doped polysilicon, not by diffusion of impurity ions, a junction area of a semiconductor substrate and the polysilicon is reduced. And a junction capacitance is minimized to improve the operational speed of the semiconductor device.

It will be apparent to those skilled in the art that various modification and variations can be made in the semiconductor device and a method for fabricating the same of the present invention without departing from the spirit or scope of the inventions. Thus, it is intended that the present invention cover the modifications and variations of this invention provided they come within the scope of the appended claims and their equivalents.

What is claimed is:

1. A method for fabricating a semiconductor device, comprising the steps of:

forming trenches in a semiconductor substrate, the trenches having sidewalls;

forming trench insulating layers in the trenches;

forming first polysilicon layers doped by impurity ions in each of the trenches, wherein the first polysilicon layers are formed over the trench insulating layers and wherein a part of each of the first polysilicon layers is in contact with a sidewall of a trench;

diffusing the impurity ions in the first polysilicon layers into the sidewalls of the trenches to form source and drain regions at opposite sides of each of the trenches; and forming a second polysilicon layer over the substrate and the first polysilicon layers and patterning the second polysilicon layer to form gates, wherein lower surfaces of the gates are formed above upper surfaces of the source and drain regions.

2. The method as claimed in claim 1, wherein the step of forming the trenches in the semiconductor substrate includes the steps of:

forming a substrate insulating layer on the semiconductor substrate and etching the substrate insulating layer to define locations of the trenches; and etching the semiconductor substrate to form the trenches.

3. The method as claimed in claim 2, wherein the substrate insulating layer is formed of any one of an oxide layer, a nitride layer, and a photoresist film.

4. The method as claimed in claim 1, wherein the trench insulating layers are formed by a chemical vapor deposition (CVD) process.

5. The method as claimed in claim 1, wherein the step of forming trench insulating layers comprises forming each of the trench insulating layers so that a recess is formed in a central region of a top surface of each of the trench insulating layers.

6. The method as claimed in claim 5, wherein the step of the forming the trench insulating layers includes the steps of:

forming the trench insulating layers on a bottom surface of each of the trenches;

forming sidewall spacers on the sidewalks of the trenches;

etching the trench insulating layers using the sidewall spacers as a mask so as to form a recess in each of the trench insulating layers; and removing the sidewall spacers.

7. The method as claimed in claim 1, wherein, after forming the first polysilicon layers, an annealing process is performed to diffuse the impurity ions in the first polysilicon layer into the sidewalls of the trenches so as to form the source and drain regions.

8. The method as claimed in claim 7, wherein the annealing process also causes a gate insulating layer to be formed on the substrate and the first polysilicon layers.

9. The method as claimed in claim 8, wherein the step of forming the gates includes the steps of:

patterning the second polysilicon layer to form floating gates on the gate insualting layer;

forming a dielectric layer on the floating gates; and forming control gates on the dielectric layer.

10. The method as claimed in claim 8, wherein the gate insulating layer formed by the annealing process is thicker over the first polysilicon layers than over the semiconductor substrate.

\* \* \* \* \*